United States Patent [19]

Moyers et al.

[11] Patent Number: 5,583,434
[45] Date of Patent: Dec. 10, 1996

[54] METHOD AND APPARATUS FOR MONITORING ARMATURE POSITION IN DIRECT-CURRENT SOLENOIDS

[75] Inventors: John C. Moyers, Oak Ridge; Howard D. Haynes, Knoxville, both of Tenn.

[73] Assignee: Martin Marietta Energy Systems, Inc., Oak Ridge, Tenn.

[21] Appl. No.: 93,846

[22] Filed: Jul. 20, 1993

[51] Int. Cl.⁶ .............................. G01B 7/14; F16K 37/00; G01R 27/16
[52] U.S. Cl. ............... 324/207.16; 137/554; 324/207.24; 324/716
[58] Field of Search .............................. 324/71.1, 207.16, 324/207.22, 207.24, 207.26, 415, 418, 654, 699, 713, 716; 137/554; 340/644, 870.31–870.33, 686; 361/154, 160, 170, 179, 187; 376/216, 258; 251/129.15

[56] References Cited

U.S. PATENT DOCUMENTS

| | | |
|---|---|---|
| 3,789,876 | 2/1974 | Kempton et al. ................... 137/554 |
| 4,112,365 | 9/1978 | Larson et al. . |
| 4,809,742 | 3/1989 | Grau ................................ 137/554 |
| 4,810,964 | 3/1989 | Granberg et al. . |
| 4,907,901 | 3/1990 | Mitchell . |
| 4,950,985 | 8/1993 | Voss et al. . |
| 5,045,786 | 9/1991 | Fischer . |
| 5,115,193 | 5/1992 | Bean et al. . |
| 5,180,978 | 1/1993 | Postma et al. . |
| 5,196,983 | 3/1993 | Stumpf ................... 324/207.16 X |
| 5,218,308 | 6/1993 | Bosebeck et al. ........... 324/207.24 X |
| 5,289,131 | 2/1994 | Heidt et al. ........................ 324/415 |
| 5,424,637 | 6/1995 | Oudyn et al. ................... 324/207.16 |

Primary Examiner—Gerard R. Strecker
Attorney, Agent, or Firm—E. A. Pennington; J. M. Spicer; H. W. Adams

[57] ABSTRACT

A method for determining the position of an armature of a dc-powered solenoid. Electrical circuitry is provided to introduce a small alternating current flow through the coil. As a result, the impedance and resistance of the solenoid coil can be measured to provide information indicative of the armature's position.

20 Claims, 2 Drawing Sheets

FIG. 3
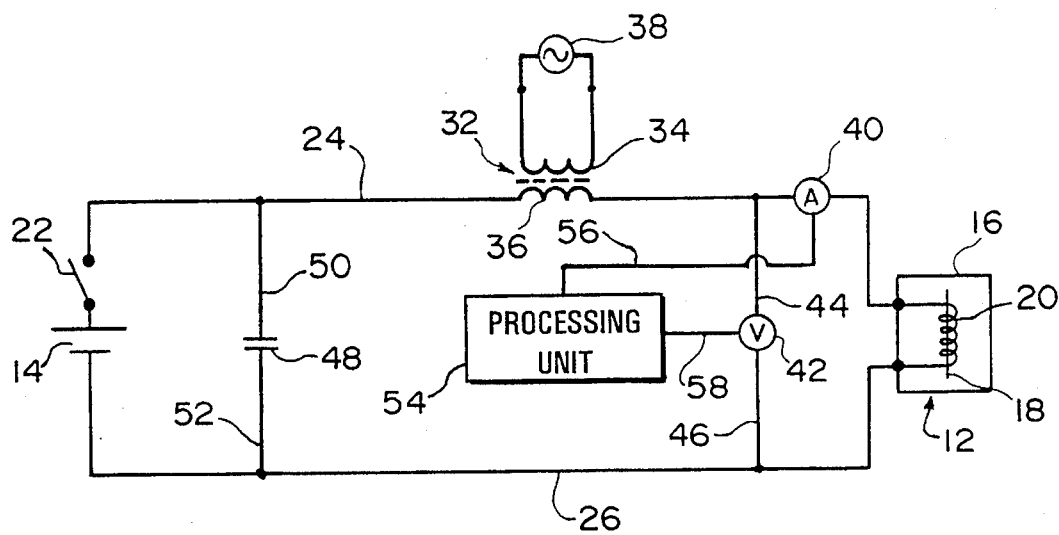
FIG. 4
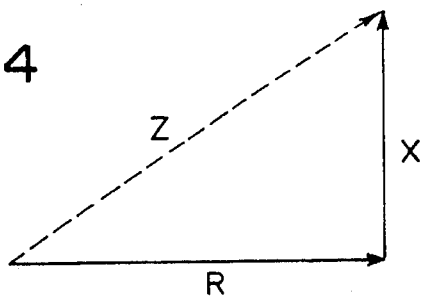
FIG. 5
| ARMATURE POSITION | DC VOLTS | DC mA | AC mV | AC uA |
|---|---|---|---|---|
| COMPLETELY INSERTED | 2.094 | 20.02 | 46.0 | 200 |
| REMOVED APPROX. 1/4 in | 2.094 | 20.04 | 45.8 | 203.8 |
| REMOVED APPROX. 1/2 in | 2.094 | 20.02 | 45.8 | 209.6 |
| REMOVED APPROX. 3/4 in | 2.094 | 20.03 | 45.8 | 215.3 |
| COMPLETELY REMOVED | 2.094 | 20.04 | 45.8 | 221.8 |

METHOD AND APPARATUS FOR MONITORING ARMATURE POSITION IN DIRECT-CURRENT SOLENOIDS

This invention was made with Government support under contract DE-AC0-84OR21400 awarded by the U.S. Department of Energy to Martin Marietta Energy Systems, Inc. and the Government has certain rights in this invention.

FIELD OF THE INVENTION

The invention relates, generally, to a method and apparatus for monitoring the status of an electromagnetic apparatus. More particularly, the invention relates to a method and apparatus for monitoring armature position in a direct current powered solenoid during energization and deenergization of the solenoid.

BACKGROUND OF THE INVENTION

Solenoid-operated devices, and especially dc-powered solenoid-operated devices, are widely used in power plants, nuclear facility plant safety systems, control rod latch mechanisms of research reactors, and many other industrial applications.

Monitoring the position and/or movement of a solenoid armature is fundamental in detecting the degradation of control mechanisms used within nuclear power plants. For example, as solenoid-operated valves age the actuated plungers experience changes in the movement associated with their functions. In fact, plungers sometimes "freeze" within the solenoid assembly, and do not move when the solenoid is properly energized and deenergized. "Freezing" of solenoid plungers may occur for a variety of reasons including changes in the properties of elastomeric seats, worn O-rings, contaminants, or faulty valve assemblies. Solenoid-operated valves are commonly found in devices such as containment isolation valve actuators, boiling-water reactor control-rod scram systems and pressurized-water-reactor safety injection systems. (For a more complete listing see R. C. Kryter, *Aging and Service Wear of Solenoid-Operated Valves Used in Safety Systems of Nuclear Power Plants Evaluation of Monitoring Methods*, NUREG/CR-4819, ORNL/TM-12038, Vol. 2, July 1992, p.2.)

A need exists for a method and apparatus capable of detecting degradation in control latch mechanisms of a new research reactor. A need also existed for a system to detect degradation of solenoid-operated control rod drives in forty-seven operating power plants that use this type of drive system. In addition to the concerns associated with the degradation of valves in nuclear power plants, many other industrial sectors utilize solenoid-operated valves and express similar concerns.

Some of these problems have been addressed in the prior art. However, these prior techniques have not been completely successful in confronting the industrial problems associated with monitoring armature position in solenoid-operated devices. For example, in solenoid-operated devices driven by an alternating current (ac), the motion of the solenoid armature, as the solenoid is energized, can be detected by monitoring the change in impedance to the flow of the alternating current through the coil of the solenoid. Characterization of the change in impedance as a function of time during the armature's stroke may be used to distinguish normal operation of the device from operation where binding or wear of the moving parts has taken place.

Further, direct current (dc) powered solenoids are widely used in nuclear power plants for control rod actuation and for solenoid-operated valves. Detecting degradation in both of these driven devices is a requisite to safe operation.

As stated above, the necessity of monitoring armature position and/or movement in solenoid-operated valves is fundamental to proper system maintenance. This is especially so in nuclear power plants. For example, an evaluation of monitoring methods to detect aging and service wear of solenoid-operated valves (SOV's) used in the safety systems of nuclear power plants was carried out by R. C. Kryter of ORNL's Instrumentation and Controls Division for the U.S. Nuclear Regulatory Commission (NRC). The experimental work demonstrated the ability to detect ac-powered solenoid armature movement and position based upon impedance measurements. However, the report states that " . . . the method is applicable only to ac-powered SOVs" and "dc-powered valves show no corresponding change in their terminal resistance as the plunger changes its position within the solenoid coil, . . . " R. C. Kryter, *supra*.

The rod control drive system in Westinghouse pressurized water reactors utilizes three dc-powered solenoids in each drive to provide motive and clamping actions. An aging assessment of these drives was carried out by Brookhaven National Laboratory (BNL) for the NRC. In that assessment, various inspection, surveillance, monitoring and maintenance techniques are discussed, including a system developed by the Japanese that uses on-line analysis of current signals and acoustic noise generated by rod movement. W. Grunther and K. Sullivan *Aging Assessment of the Westinghouse PWR Control Rod Drive System*, NUREG/CR, BNL NUREG 52232, March 1990 (Draft), p.6–14. That system, used to indicate preventive maintenance needs, develops a trace of coil current versus time during coil energization. Movement of the solenoid armature induces a perturbation in the current trace at the time movement occurs due to generation of back emf that partially counters the supplied current. However, anomalous behavior along the length of the stroke is not detectable by this system. The BNL report also mentions the use of a current signature analysis technique at one plant, in which the current to each coil is traced during rod motion Id at p. 8—8. It is asserted that this technique determines the acceptability of the power circuitry, the logic circuitry and the coil integrity, as well as providing a rough indication of mechanical interferences. Further details are not provided. Id.

As demonstrated in U.S. Pat. No. 4,950,985, to Voss et al., attempts have been made in the prior art to monitor the position of an armature in a coil/armature magnetic system. Specifically, the patent discloses an electromagnet having a dc-powered magnet with a coil, an armature or plunger which reciprocates within and along the axis of the coil, and an impulse generator which introduces an exciting frequency into the resonant circuit of the system. The resonant frequency of the apparatus is "identified by an evaluator which includes any device capable of recognizing and interpreting the various signals from the resonant circuit in response to the test signal introduced into the resonant circuit and to determine on the basis of these response signal the position of the armature." (Col 2, lines 60–66).

The Voss patent, however, fails to disclose the introduction of an alternating current flow into the solenoid coil to monitor armature position during both energization and deenergization of the solenoid-operated apparatus. As a result, the Voss patent is not capable of monitoring armature position based upon the impedance and resistance of the solenoid coil.

The use of ac and dc energy for the purpose of providing a proximity sensor that has reduced temperature sensitivity is proposed in U.S. Pat. No. 5,180,978, to Postma et al.. The Postma proximity sensor relies upon the application of a high frequency alternating current through the coil winding. In Postma, as the sensed device is moved toward and away from the sensor, the ac resistance and dc resistance are measured to determine the position of the sensed apparatus. In addition, the Postma sensor also includes a system to correct for changes in temperature that might effect necessary calculations.

The patents to Bean et al. (U.S. Pat. No. 5,115,193), Fischer (U.S. Pat. No. 5,045,786), Granber et al. (U.S. Pat. No. 4,810,964), and Larson et al. (U.S. Pat. No. 4,112,365) disclose other electromagnetic devices utilizing systems for monitoring conditions that are relevant to the operation of the electromagnetic apparatuses.

In view of the complex prior art systems discussed above, there is a need for a simple and reliable system that will allow a user to monitor the position of a solenoid's armature whether the solenoid is energized or deenergized.

SUMMARY OF THE INVENTION

It is an object of the invention to provide a method and an apparatus for monitoring an electromagnetic device by generating, and applying, an alternating current flow to the electromagnetic device that will indicate the operating characteristics of the electromagnetic device.

It is a further object of the invention to provide a method and an apparatus for monitoring armature movement of a solenoid throughout the entire stroke length.

It is another object of the invention to monitor the armature movement of a solenoid during both energization and deenergization.

It is an object of the instant invention to provide a method and an apparatus for monitoring the armature movement of dc-powered solenoid by applying a small alternating current to the solenoid coil.

It is also a further object of the invention to provide a method and apparatus for diagnosing problems in both dc-and ac-powered solenoid-operated components in the nuclear power industry, as well as throughout general industry.

These and other objects of the invention are achieved by the instant method and apparatus for monitoring the position and/or movement of the armature of a powered solenoid. As should be readily apparent, if a system is capable of monitoring the position of an object, movement of the object can be readily determined based upon the measured position of the object. The reverse applies when movement of the object is initially measured. Consequently, while the instant method and apparatus provides a user with continuous information regarding the position of a solenoid armature, it inherently provides information regarding movement of the solenoid armature. This distinction is important, for example, when a user is interested in monitoring whether the armature of a solenoid-operated valve has frozen within the housing.

The invention includes a power source supplying energy to the solenoid and an electrical circuitry providing a small alternating current flow, i.e., a signal flow, to the solenoid. Additionally, means are provided for continuously measuring the current and voltage of the power source flowing through the solenoid coil, as well as the alternating current flowing through the solenoid coil. The position of the armature is finally calculated based upon the current and voltage of the alternating current and the power source flowing through the solenoid coil. In use, the solenoid is energized and deenergized by the power source to move the armature in a predetermined manner, while a small alternating current flow is applied to the solenoid coil. The voltage and resistance produced by the power source flow through the solenoid coil and voltage and resistance produced by the alternating current flow through the solenoid coil are measured, and the properties are utilized to determine and monitor the position of the solenoid armature.

By applying a continuous alternating current flow across the solenoid coil, a simple and reliable system for monitoring energized and deenergized solenoids is provided, which overcomes the problems associated with the prior art control systems.

Other objects, advantages and salient features of the invention will become apparent from the following detailed description, which, taken in conjunction with the annexed drawings, discloses preferred embodiments of the invention.

BRIEF DESCRIPTION OF THE DRAWINGS

FIG. 3 is a schematic showing the circuitry of the instant invention.

FIG. 4 is a vector diagram for impedance.

FIG. 5 is a chart showing experimental results obtained by the invention.

DETAILED DESCRIPTION OF THE INVENTION

Figure 1:
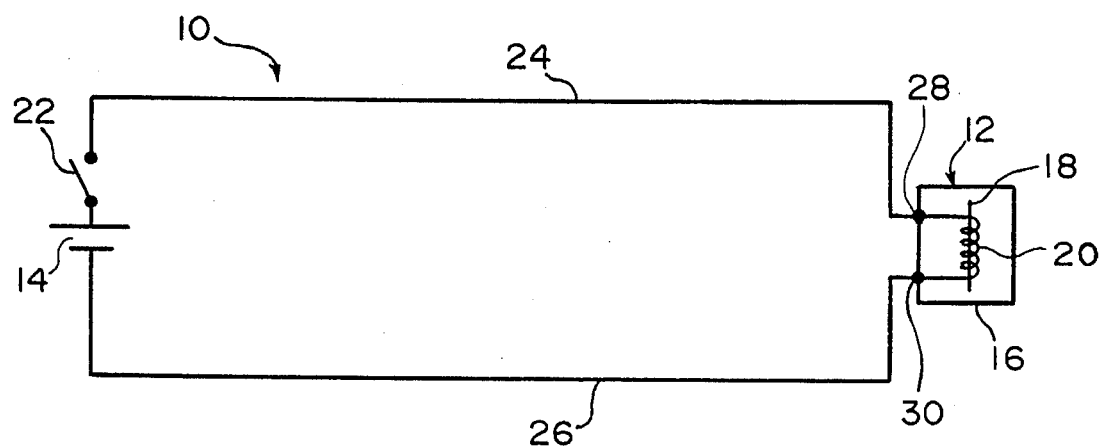
FIG. 1 is a schematic showing the conventional circuitry for a dc-powered solenoid-operated apparatus.
Figure 2:
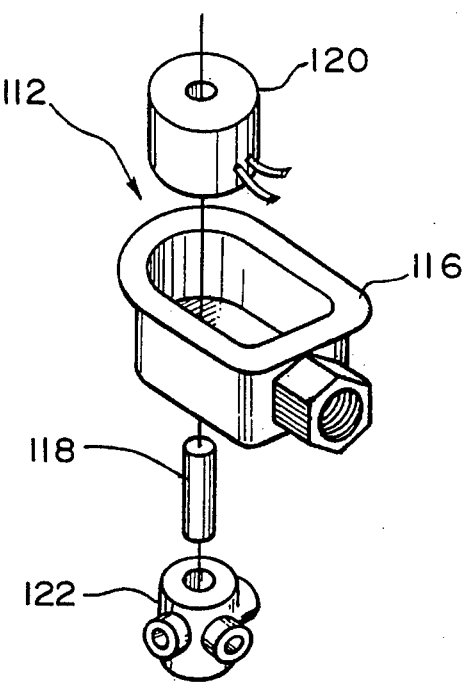
FIG. 2 is an exploded perspective view of a solenoid-operated valve.

The instant invention provides a method and apparatus for monitoring the position and movement of the armature in a dc-powered solenoid during both the energization stroke and the deenergization stroke of the solenoid. FIG. 1 shows a circuit 10 commonly used with a dc-powered solenoid 12. The circuit 10 includes a dc-power source 14, a solenoid housing 16, solenoid armature 18, and a solenoid coil 20. The solenoid 12 as discussed in the description of the invention refers to a complete solenoid-operated device, with only the coil 20, housing 16, and armature 18 being shown for the sake of clarity in FIGS. 1 and 3. That is, the solenoid 12 as referred to herein includes at least a housing 16, an armature 18 and a solenoid coil 20. As shown in FIG. 2, the armature may be a plunger 118 of a solenoid-operated valve 112. With reference to FIG. 1, the circuit includes a solenoid 12, a dc-power source 14, and a switch 22 controlling the flow of the dc power to the solenoid. The dc-power source 14 is electrically coupled to the solenoid 12 through first and second electrical conductors 24 and 26. The first and second electrical conductors 24 and 26 are respectively coupled to appropriate terminals 28, 30 on the solenoid 12 to complete an electrical circuit which includes the solenoid 12 and the dc-power source 14.

In use, the switch 22 is selectively opened or closed to deenergize or energize, respectively, the solenoid coil 20. Energization of the solenoid coil 20 actuates the armature 18 to move in a manner that will be subsequently discussed in greater detail.

A similar sequence occurs in ac-powered solenoids. As was previously discussed, prior art devices utilizing ac-powered solenoids require a signal flow to make necessary calculations. Since no signal flows through conventional ac-powered solenoids when the solenoid has been deenergized, it would be impossible to use the ac power source of conventional devices to monitor armature position.

As is known, solenoids can have a variety of applications, such as in solenoid-operated valves (SOV's). All known and analogous uses of solenoids can be adapted to employ the present invention. With reference to FIG. 2, a typical solenoid-operated valve 112 moves between open and closed positions based upon the energization and deenergization of a solenoid coil 120 that is positioned within a housing 116. Actuation of the solenoid coil 120 lifts a plunger 118 operatively coupled to a valve element 122 to thereby move same between open and closed positions. Solenoid-operated valves are commonly found in devices such as containment isolation valve actuators, boiling-water reactor control-rod scram systems and pressurized-water-reactor safety injection systems. Other uses are detailed in the aforementioned Kryter publication. As discussed previously, "freezing" encountered in solenoid-operated valves, such as those discussed above can be prevented and monitored by the use of the instant monitoring method and apparatus.

In accordance with the instant invention as shown in FIG. 3, an apparatus for monitoring armature position in a dc-powered solenoid provides a continuous alternating current flow to the solenoid coil. The circuit described previously with respect to FIG. 1 is modified to provide the monitoring function.

Transformer 32 has a robust secondary winding 36 series connected in the conductor 24 and a primary winding 34 energized by an ac-power source 38. The transformer 32 and ac-power source 38 work together to introduce a small continuous alternating current flow through the solenoid coil 20. In fact, the instant invention will function properly with an ac power level that is as small as about 1/4000th of the dc power level.

An ammeter 40, series connected with the solenoid coil 20, separately measures the ac and dc current flowing through the solenoid coil 20. A voltmeter 42 is parallel connected with the solenoid coil and separately measures both the ac and dc voltage across the solenoid coil. The voltmeter 42 is connected to the first and second electrical conductors 24 and 26 by third and fourth electrical conductors 44 and 46, respectively. The voltmeter 42 is connected to the first electrical conductor 24 between the robust secondary winding 36 and the solenoid coil 20. The electronic circuitry is completed by the installation of a small capacitor 48 between the first and second electrical conductors 24 and 26. The capacitor 48 is installed on the solenoid 12 side of the switch 22 to provide a complete circuit for the alternating current flow when the switch 22 is open.

By monitoring the current and voltage produced by the dc flow through the solenoid coil 20 and the current and voltage produced by the ac flow through the solenoid coil 20, it is possible to determine the position of the solenoid armature 18 (eg., the plunger 118 shown in FIG. 2). As a result of the ac flow introduced into the solenoid coil 20, the instant invention provides a method and apparatus for continuously monitoring armature 18 position during steady state, energization and deenergization of the solenoid 12. Calculations regarding the measured voltage and current are performed by a processing unit 54 that is connected to the ammeter 40 and the voltmeter 42 by seventh and eighth electrical conductors 56, 58, respectively. The processing unit 54 determines the armature 18 position based upon the mathematical relations discussed below.

Specifically, the inductance of the solenoid is a function of the solenoid coil's geometry as defined by the number of turns of the coil and the coil dimensions. Inductance is further influenced by the core material, core geometry, and the core location relative to the coil. Because the solenoid armature is a significant part of the core, solenoid inductance changes as the armature position varies.

Inductive Reactance is defined by the following formula:

$$X_L = 2\pi f L$$

where:

$X_L$ = inductive reactance in ohms;

f = frequency in Hz; and

L = inductance in henries.

Additionally, it is known that the impedance ('Z'), of the solenoid coil, is the vector sum of the resistance ('R'), of the solenoid coil, and the inductive reactance ('$X_L$'), of the solenoid coil, where the vector representation of R and $X_L$ are at right angles to one another as shown in FIG. 4. This relation may be written as follows:

$$Z = \sqrt{R^2 + X_L^2}$$

Based upon the method and apparatus provided by the instant invention, the resistance and impedance of the solenoid coil are readily available from simple measurements. Specifically, the resistance of the solenoid coil is the ratio of the dc voltage across the solenoid coil to the dc current flowing through the solenoid coil. The resistance, as determined from the direct current flow, is independent of the armature's position. Additionally, the impedance of the solenoid coil is the ratio of the ac voltage across the coil to the ac current flowing through the solenoid coil. As will subsequently be shown in more detail, the impedance of the solenoid coil, which is based upon the ratio of the ac voltage across the coil to the ac current flowing through the solenoid coil varies as a function of the armature position.

The inductive reactance of the solenoid can be determined based upon the formula $$X_L = \sqrt{Z^2 - R^2}$$

It further follows that the inductance of the solenoid can also be determined from the formula $$L = \frac{\sqrt{Z^2 - R^2}}{2\pi f}$$

where Z and R are determined based upon the relations previously discussed, and f is the frequency of the alternating current. Because the inductance of the solenoid varies as a function of the position of the armature of the solenoid, the position of the armature of the solenoid can readily be determined where the inductance of the solenoid is known. It further follows that the position of the armature can be determined based upon the impedance calculated from the current and voltage of the ac flow, since changes in impedance are related to changes in the inductance of the solenoid. If impedance is utilized to determine armature position, a scale of impedance values would be calibrated with corresponding armature positions.

As becomes readily apparent from the mathematical foundation of the instant invention, improved sensitivity is attained at higher frequencies of the applied alternating current flow. Higher frequencies result in a large inductive reactance which minimizes the effect of any change in the impedance caused by changes in the fixed resistance term determined from the direct current flow.

Additionally, reliability of the instant invention is further enhanced when known resistance variations due to changes in the solenoid temperature are monitored so that test-to-test correction of impedance for temperature effects can be made.

The usefulness of the instant invention is demonstrated by the following test results. In this experiment, a coreless solenoid having an open bore of approximately ½ inch diameter, was powered by a composite signal comprised of a dc voltage component generated by a dc-power source and a 60-Hz ac voltage component generated by a signal generator. Instrumentation consisted of two Fluke volt-ohmmeters, one to measure the ac and dc current and the other to measure the ac and dc voltage. A 5/16 inch steel socket head cap screw was used as the armature. Measurements of dc voltage, ac voltage, dc current, and ac current were taken for different armature positions, ranging from fully inserted to completely removed with three intermediate positions. The data collected as a result of this experimentation is shown in FIG. 5.

The principle of the instant invention is clearly shown to be sound, even with an ac power level of only 1/4000th of the dc power level. At such levels the ac power would have no effect on the solenoid operation. Additionally, with suboptimum frequency, the test results demonstrate that the ac current signal varies approximately 11% with full travel of the armature.

An alternative application of the basic concept proposed by the instant invention is that of monitoring both strokes of ac-powered solenoid-operated equipment. In addition, data acquisition/analysis hardware and software to accept the raw data, derive the temperature corrected impedance, convert the impedance to instantaneous armature position, and produce digital or graphical output of armature position versus time could be added.

The invention should find wide application in diagnosing problems in both dc-and ac-powered solenoid-operated components in the nuclear power industry, as well as throughout general industry.

While advantageous embodiments have been chosen to illustrate the invention, it will be understood by those skilled in the art that various changes and modifications can be made therein without departing from the scope of the invention as defined in the appended claims.

What is claimed is:

1. An apparatus for continuously monitoring armature position throughout the entire stroke length of a d.c. solenoid electrically coupled to a power source for supplying a d.c. voltage to a coil of the solenoid comprising:

means for continuously supplying a continuous a.c. current signal to the solenoid coil during eneraization and deenergization of the coil with a d.c. current;

means for continuously measuring a.c. and d.c. current flowing through the solenoid coil and a.c. and d.c. voltage across the solenoid coil; and means for determining impedance of the solenoid coil based on the measured values of a.c. current and voltage, the impedance varying in accordance to a position of the solenoid armature.

2. An apparatus according to claim 1, wherein the means for supplying a continuous a.c. current signal comprises a transformer having a secondary coil in one leg of a d.c. power supply of the solenoid, and a primary coil receiving a signal from an a.c. source.

3. An apparatus according to claim 1, wherein the means for continuously measuring both a.c. and d.c. current and voltage flowing through the solenoid coil includes an ammeter connected in series with the solenoid coil.

4. An apparatus according to claim 1, wherein the means for continuously measuring both a.c. and d.c. current and voltage flowing through the solenoid coil includes a voltmeter connected in parallel with the solenoid coil.

5. An apparatus according to claim 1, further comprising a capacitor connected in parallel with the solenoid coil and between two d.c. conductors leading to the solenoid.

6. An apparatus according to claim 1, wherein correlating means comprises means for correlating a.c. current through the solenoid coil to the position of the armature.

7. A method for continuously monitoring armature position throughout the entire stroke length of a d.c. solenoid electrically coupled to a power source for supplying a d.c. voltage to a coil of the solenoid comprising the steps of:

continuously supplying a continuous a.c. signal to the solenoid coil during deenergization and energization of the solenoid coil with a d.c. current;

continuously measuring a.c. and d.c. current flowing through the solenoid coil and a.c. and d.c. voltage across the solenoid coil; and determining the impedance of the solenoid coil based on the measured values of a.c. current and voltage, the impedance varying in accordance to a position of the solenoid armature.

8. A method according to claim 7, wherein the step of supplying a continuous a.c. current signal comprises connecting a secondary coil of a transformer to one leg of a d.c. power supply of the solenoid, and supplying a primary coil of the transformer with a signal from an a.c. source.

9. A method according to claim 7, wherein the step of continuously measuring both a.c. and d.c. current and voltage flowing through the solenoid coil includes connecting an ammeter in series with the solenoid coil.

10. A method according to claim 7, wherein the step of continuously measuring both a.c. and d.c. current and voltage flowing through the solenoid coil includes connecting a voltmeter in parallel with the solenoid coil.

11. A method according to claim 7, further comprising connecting a capacitor in parallel with the solenoid coil and between two d.c. conductors leading to the solenoid.

12. A method according to claim 7, wherein the correlating step comprises correlating a.c. current through the solenoid coil to the position of the armature.

13. A method according to claim 7, wherein the step of supplying a continuous a.c. signal includes supplying a continuous a.c. signal during an actuation stroke of the solenoid.

14. A method according to claim 7, wherein the step of supplying a continuous a.c. signal includes supplying a continuous a.c. signal during both an actuation and return stroke of the solenoid.

15. An apparatus for monitoring operation of a d.c. solenoid having a coil and an armature movable through a stroke length between operative positions in response to energization and deenergization of the coil, the apparatus comprising:

an a.c. current source selectively coupled to a power circuit of the solenoid to provide a continuous a.c. current, the a.c. current having a value which varies in accordance with the position of the armature;

a d.c. current source selectively coupled to the power circuit to energize the solenoid coil with d.c. current; and a current detector coupled to the power circuit for continuously measuring a.c. current when the solenoid coil is energized and deenergized to move the armature between the operative positions through the stroke length, wherein changes in the measured a.c. current correspond to variations in armature position.

16. An apparatus according to claim 15, wherein the a.c. current source includes a current transformer having a primary winding and a secondary winding, the secondary winding being series connected to a circuit which includes the solenoid coil, and an a.c. signal generator coupled to the primary winding of the current transformer which, when energized, induces a continuous a.c. current in the secondary winding and thus the solenoid coil.

17. An apparatus according to claim 16, wherein the current detector is series connected to the coil, and measures both a.c. current when the signal generator is energized and d.c. current when the coil is energized by a d.c. source coupled to the power circuit.

18. An apparatus according to claim 16, further comprising a voltage detector parallel connected to the coil for continuously measuring a.c. voltage when the signal generator is energized and d.c. voltage when the coil is energized by a d.c. source coupled to the circuit.

19. An apparatus according to claim 15, further comprising a processor unit receiving a.c. current data from the current detector and correlating the a.c. current data to positions of the armature based on computed values of one of impedance and inductance of the power circuit.

20. An apparatus according to claim 15, further comprising a capacitor parallel connected in the circuit between the d.c. current source and the solenoid coil.

* * * * *